US012795979B2

(12) United States Patent
Hao et al.

(10) Patent No.: US 12,795,979 B2

(45) Date of Patent: Nov. 10, 2026

(54) SEMICONDUCTOR DEVICE AND METHOD FOR MANUFACTURING THE SAME

(71) Applicant: INNOSCIENCE (SUZHOU) TECHNOLOGY CO., LTD., Suzhou City (CN)

(72) Inventors: Ronghui Hao, Suzhou City (CN); Chuan He, Suzhou City (CN); Qingyuan He, Suzhou City (CN); King Yuen Wong, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 1116 days.

(21) Appl. No.: 17/621,684

(22) PCT Filed: Nov. 12, 2021

(86) PCT No.: PCT/CN2021/130453

§ 371 (c)(1),
(2) Date: Dec. 22, 2021

(87) PCT Pub. No.: WO2023/082202

PCT Pub. Date: May 19, 2023

(65) Prior Publication Data

US 2024/0030335 A1 Jan. 25, 2024

(51) Int. Cl.

*H10D 30/47* (2025.01)

*H10D 30/01* (2025.01)

(Continued)

(52) U.S. Cl.

CPC ....... *H10D 30/4755* (2025.01); *H10D 30/015* (2025.01); *H10D 62/8503* (2025.01); *H10D 62/854* (2025.01); *H10D 64/258* (2025.01)

(58) Field of Classification Search

CPC ............ H01L 29/7787; H01L 29/2003; H01L 29/207; H01L 29/41775; H01L 29/66462;

(Continued)

(56) References Cited

U.S. PATENT DOCUMENTS 8,866,192 B1 10/2014 Chen et al.
2014/0091312 A1* 4/2014 Jeon .................. H01L 29/66204 438/135

(Continued)

FOREIGN PATENT DOCUMENTS

CN 104094408 B 11/2016
CN 106158948 A 11/2016

(Continued)

OTHER PUBLICATIONS

International Search Report and Written Opinion of the corresponding PCT application No. PCT/CN2021/130453 mailed on Jun. 24, 2022.

*Primary Examiner* — Samuel Park

(74) *Attorney, Agent, or Firm* — Li & Cai Intellectual Property (USA) Office

(57) ABSTRACT

A semiconductor device includes a first and a second nitride-based semiconductor layers, a doped nitride-based semiconductor layer, a plurality of negatively-charged ions, a source electrode, and a drain electrode. The negatively-charged ions are selected from a highly electronegative group and distributed within a plurality of depletion regions which extend downward from the doped nitride-based semiconductor layer and are located beneath the gate electrode. Any pair of the adjacent depletion regions are separated from each other. The source electrode is disposed above the second nitride-based semiconductor layer and spaced apart from the depletion regions. The drain electrode is disposed (Continued)

1A above the second nitride-based semiconductor layer and spaced apart from the depletion regions.

18 Claims, 10 Drawing Sheets

(51) Int. Cl.

| | |
|---|---|
| ***H10D 62/85*** | (2025.01) |
| ***H10D 62/854*** | (2025.01) |
| ***H10D 64/23*** | (2025.01) |

(58) Field of Classification Search

CPC ............. H01L 29/1029; H01L 29/1066; H01L 29/7786

See application file for complete search history.

(56) References Cited

U.S. PATENT DOCUMENTS

| | | | | |
|---|---|---|---|---|
| 2018/0308966 | A1* | 10/2018 | Jacquet | H01L 29/2003 |
| 2019/0296139 | A1* | 9/2019 | Wei | H01L 29/2003 |
| 2020/0119178 | A1* | 4/2020 | Okita | H01L 29/7788 |
| 2020/0212212 | A1 | 7/2020 | Chen | |
| 2021/0167202 | A1 | 6/2021 | Lu et al. | |

FOREIGN PATENT DOCUMENTS

| | | | |
|---|---|---|---|
| CN | 112331719 | A | 2/2021 |
| CN | 112771677 | A | 5/2021 |
| CN | 112951909 | A | 6/2021 |

* cited by examiner

1A

1C

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a semiconductor device having negatively-charged ions to laterally deplete 2DEG.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a semiconductor device is provided. A semiconductor device includes a first nitride-based semiconductor layer, a second nitride-based semiconductor layer, a doped nitride-based semiconductor layer, a plurality of negatively-charged ions, a source electrode, and a drain electrode. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The doped nitride-based semiconductor layer is disposed between the second nitride-based semiconductor layer and the gate electrode. The negatively-charged ions are selected from a highly electronegative group and distributed within a plurality of depletion regions which extend downward from the doped nitride-based semiconductor layer and are located beneath the gate electrode. Any pair of the adjacent depletion regions are separated from each other. The source electrode is disposed above the second nitride-based semiconductor layer and spaced apart from the depletion regions. The drain electrode is disposed above the second nitride-based semiconductor layer and spaced apart from the depletion regions.

In accordance with one aspect of the present disclosure, a semiconductor device is provided. A semiconductor device includes a first nitride-based semiconductor layer, a second nitride-based semiconductor layer, a doped nitride-based semiconductor layer, a gate electrode, a plurality of depletion regions, a source electrode, and a drain electrode. The second nitride-based semiconductor layer is disposed on the first nitride-based semiconductor layer and has a bandgap greater than a bandgap of the first nitride-based semiconductor layer. The doped nitride-based semiconductor layer is disposed above the second nitride-based semiconductor layer. The gate electrode is disposed above the doped nitride-based semiconductor layer. The plurality of depletion regions are formed in the first and second nitride-based semiconductor layers by doping negatively-charged ions that are selected from a highly electronegative group. The depletion regions are located beneath the gate electrode and the doped nitride-based semiconductor layer, and any pair of the adjacent depletion regions are separated from each other. The source electrode is disposed above the second nitride-based semiconductor layer and spaced apart from the depletion regions. The drain electrode is disposed above the second nitride-based semiconductor layer and spaced apart from the depletion regions.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer. A blanket doped nitride-based semiconductor layer is formed on the second nitride-based semiconductor layer. A mask layer with openings is formed over the blanket doped nitride-based semiconductor layer to expose portions of the blanket doped nitride-based semiconductor layer. An ion implantation process is performed on the exposed portions of the blanket doped nitride-based semiconductor layer using negatively-charged ions selected from highly electronegative group, so as to form a plurality of depletion regions separated from each other. A gate electrode is formed over the blanket doped nitride-based semiconductor layer. The blanket doped nitride-based semiconductor layer is patterned to form a doped nitride-based semiconductor layer and to expose the second nitride-based semiconductor layer. The depletion regions extend downward from the doped nitride-based semiconductor layer.

By the above configuration, the doped nitride-based semiconductor layer and the negatively-charged ions in the depletion regions can collaboratively deplete at least one zone of the 2DEG region directly under the gate electrode. The depletion regions can be formed as an array. Portion of the 2DEG region vertically overlapping with the depletion regions are depleted. The depletion regions can further laterally deplete the rest of the 2DEG region. Accordingly, the off-state of the semiconductor device is achieved.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
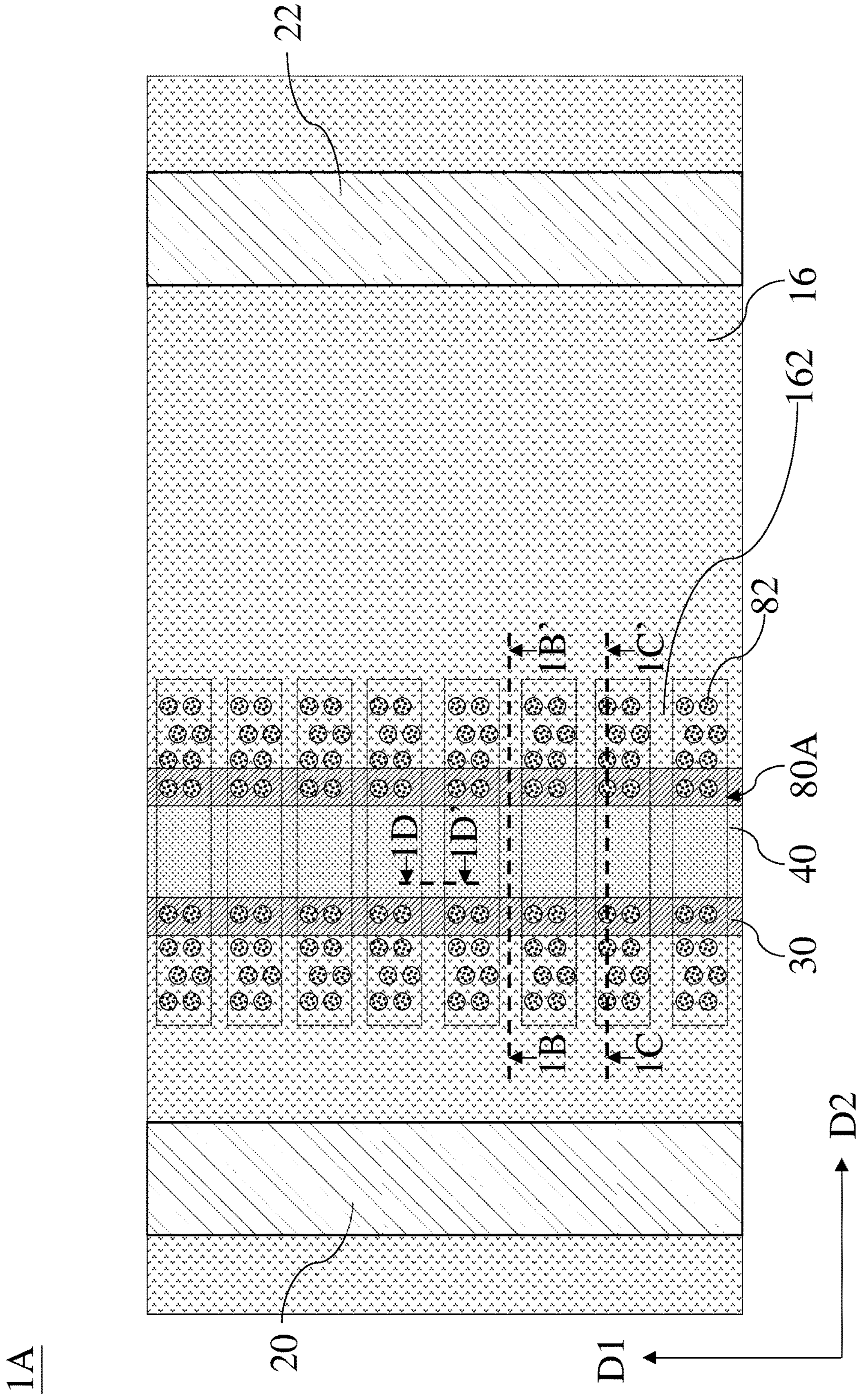
FIG. 1A is a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
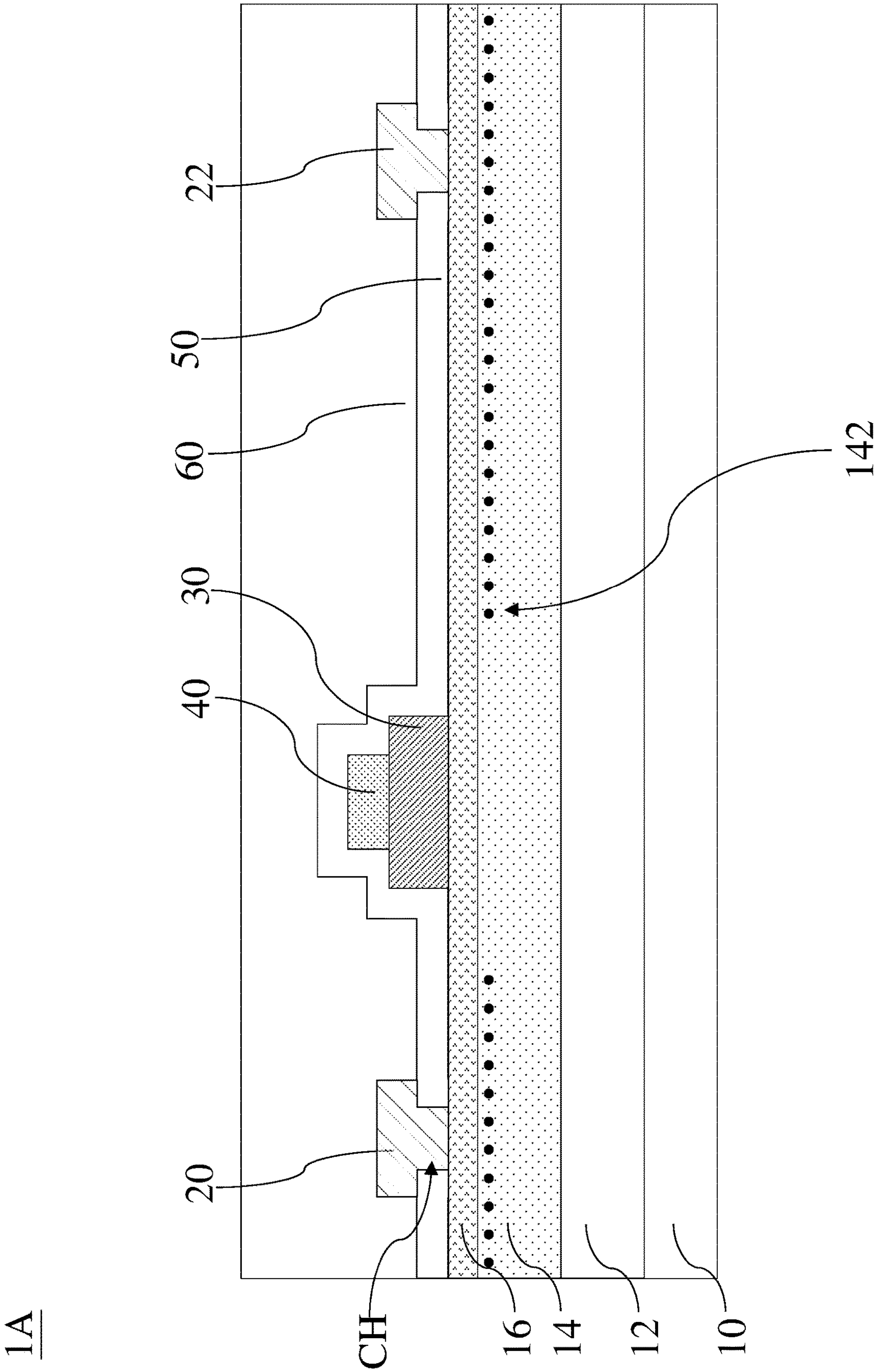
FIG. 1B is a vertical cross-sectional view across a line 1B-1B' of the semiconductor device in FIG. 1A.

FIG. 1A is a top view of a semiconductor device 1A according to some embodiments of the present disclosure. FIG. 1B is a vertical cross-sectional view across a line 1B-1B' of the semiconductor device 1A in FIG. 1A. The directions D1 and D2 are labeled in the FIG. 1A, in which the directions D1 and D2 are perpendicular to each other. For example, the direction D1 is the vertical direction and the direction D2 is the horizontal direction.

The semiconductor device 1A includes a substrate 10, a buffer layer 12, nitride-based semiconductor layers 14 and 16, electrodes 20 and 22, a doped nitride-based semiconductor layer 40, a gate electrode 40, and passivation layers 50 and 60.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14. The buffer layer 12 can be configured to reduce lattice and thermal mismatches between the substrate and the nitride-based semiconductor layer 14, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof. In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14 can be disposed on/over/above the buffer layer 12. The nitride-based semiconductor layer 16 can be disposed on/over/above the nitride-based semiconductor layer 14. The buffer layer 12 is disposed beneath the nitride-based semiconductor layer 14. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y\leq1$, $AlxGa_{(1-x)}N$ where $x\leq1$. The exemplary materials of the nitride-based semiconductor layer 16 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$.

The exemplary materials of the nitride-based semiconductor layers 14 and 16 are selected, such that the nitride-based semiconductor layer 161 has a bandgap (i.e., forbidden band width) greater/higher than a bandgap of the nitride-based semiconductor layer 14, which causes electron affinities thereof different from each other and forms a heterojunction therebetween. For example, when the nitride-based semiconductor layer 14 is selected as an unintentionally-doped GaN layer (or can be referred to as an undoped GaN layer) having a bandgap of approximately 3.4 eV, the nitride-based semiconductor layer 16 can be selected as an AlGaN layer having bandgap of approximately 4.0 eV. As such, the nitride-based semiconductor layers 14 and 16 can serve as a channel layer and a barrier layer, respectively. A triangular well potential is generated at a bonded interface between the channel and barrier layers, so that electrons accumulate in the triangular well, thereby generating a two-dimensional electron gas (2DEG) region 142 adjacent to the heterojunction. Accordingly, the semiconductor device 1A is available to include at least one GaN-based high-electron-mobility transistor (HEMT).

The electrodes 20 and 22 can be disposed on/over/above the nitride-based semiconductor layer 16. The electrodes 20 and 22 can be in contact with the nitride-based semiconductor layer 16. In some embodiments, the electrode 20 can serve as a source electrode. In some embodiments, the electrode 20 can serve as a drain electrode. In some embodiments, the electrode 22 can serve as a source electrode. In some embodiments, the electrode 22 can serve as a drain electrode. The role of the electrodes 20 and 22 depends on the device design. The electrodes 20, 22 can extend along the direction D1. The electrodes 20, 22 can be arranged along the direction D2.

In some embodiments, the electrodes 20 and 22 can include, for example but are not limited to, metals, alloys, doped semiconductor materials (such as doped crystalline silicon), compounds such as silicides and nitrides, other conductor materials, or combinations thereof. The exemplary materials of the electrodes 20 and 22 can include, for example but are not limited to, Ti, AlSi, TiN, or combinations thereof. Each of the electrodes 20 and 22 may be a single layer, or plural layers of the same or different composition. The electrodes 20 and 22 form ohmic contacts with the nitride-based semiconductor layer 16. Furthermore, the ohmic contacts can be achieved by applying Ti, Al, or other suitable materials to the electrodes 20 and 22. In some embodiments, each of the electrodes 20 and 22 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The doped nitride-based semiconductor layer 30 can be disposed on/over/above the nitride-based semiconductor layer 16. The doped nitride-based semiconductor layer 30 can be in contact with the nitride-based semiconductor layer 16. The doped nitride-based semiconductor layer 30 can be located between the electrodes 20 and 22. The profile of the doped nitride-based semiconductor layer 30 can be, for example, a rectangular profile. In some embodiments, the profile of the doped nitride-based semiconductor layer 30 can be, for example, a trapezoid profile. The doped nitride-based semiconductor layer 30 can extend along the direction D1.

The exemplary materials of the doped nitride-based semiconductor layer 30 can be p-type doped. The doped nitride-based semiconductor layer 30 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg.

In some embodiments, the nitride-based semiconductor layer 14 includes undoped GaN and the nitride-based semiconductor layer 16 includes AlGaN, and the doped nitride-based semiconductor layer 30 is p-type GaN layer which can bend the underlying band structure upwards and to deplete the corresponding zone of the 2DEG region 142, so as to place the semiconductor device 1A into an off-state condition.

The gate electrode 40 can be disposed on/over/above the doped nitride-based semiconductor layer 30. The gate electrode 40 can be in contact with the doped nitride-based semiconductor layer 30, such that the doped nitride-based semiconductor layer 30 can be disposed/sandwiched between the gate electrode 40 and the nitride-based semiconductor layer 16. The gate electrode 40 can be disposed between the electrodes 20 and 22. The gate electrode 40 can extend along the direction D1.

In some embodiments, the gate electrode 40 may include metals or metal compounds. The gate electrode 40 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 40 may include, for example but are not limited to, nitrides, oxides, silicides, doped semiconductors, or combinations thereof.

The electrodes 20 and 22 and the gate electrode 40 can constitute a GaN-based HEMT device with the 2DEG region 142. In the present disclosure, the GaN-based HEMT device can be applied to high current products. Practically, by altering an Al content or a thickness of a barrier layer, a concentration of a 2DEG region can be greatly enhanced, which is made for satisfying high current applications. For example, the GaN-based HEMT device of the present disclosure may have a 2DEG density in a range from about $5*10^{12}$ $cm^{-2}$ to about $5*10^{13}$ $cm^{-2}$. However, with respect to high current products, a doped nitride-based semiconductor layer may not completely deplete a desired zone of a 2DEG region directly; and therefore, some undepleted electrons will remain in such zone, leading to a higher off-state current.

In order to achieve fully normally-off, other manners for disrupting continuity of 2DEG region may be used. For example, one way to achieve a normally-off n-channel semiconductor device is to form a recess structure into a barrier layer and fill the recess structure with a gate electrode therein, thereby extinguishing a zone of the 2DEG region directly under the gate electrode. Accordingly, there is a need to perform a destructive step, such as an etching step, to an AlGaN barrier layer. Moreover, the depth of the recess structure is need to be precisely controlled during the etching step, and thus the yield rate is hard to be promoted.

At least in order to avoid the afore-mentioned issues, the present disclosure provides a novel way to further deplete electrons and to achieve a normally-off device.

Referring to FIG. 1A, a plurality of depletion regions 80A can be formed in the structure by doping negatively-charged ions 82. In the exemplary illustration of FIG. 1A, the depletion regions 80A are formed in the doped nitride-based semiconductor layer 30 and the nitride-based semiconductor layer 16. The depletion regions 80A can be further formed in the underlying layers (e.g., the nitride-based semiconductor layer 14).

The negatively-charged ions 82 are distributed within the depletion regions 80A. In some embodiments, the doping negatively-charged ions 82 can be selected from a highly electronegative group. In some embodiments, the highly electronegative group can include fluorine or chlorine.

The depletion regions 80A are disposed between the electrodes 20 and 22. The depletion regions 80A overlap with the doped nitride-based semiconductor layer 30 and the gate electrode 40 in the top view (i.e., vertically overlapping). The depletion regions 80A can be arranged along the direction D1. The depletion regions 80A are separated from each other along the direction D1. Each of the depletion regions 80A can extend along the direction D2.

Each of the depletion regions 80A can horizontally extend through the doped nitride-based semiconductor layer 30 and the gate electrode 40 in the top view. Each of the depletion regions 80A can extend from the left side to the right side of the doped nitride-based semiconductor layer 30 and the gate electrode 40. The electrodes 20 and 22 are spaced apart from the depletion regions 80A. The electrode 20 is closer to the depletion regions than the electrode 22.

As the negatively-charged ions 82 introduced/implanted in the interstitial sites of the layers (e.g., the nitride-based semiconductor layer 16), the negatively-charged ions 82 can become a negative fixed charge in the nitride-based semiconductor layer 16, resulting in increase of the potential of the barrier layer (i.e., the nitride-based semiconductor layer 16). As such, zones of the 2DEG region 142 directly beneath the depletion regions 80A are depleted.

With respect to the depleted zones of the 2DEG region 142 directly beneath the depletion regions 80A, the resistance thereof is thus increased due to depletion. Hence, any pair of the adjacent depletion regions 80A is formed to be separated from each other for avoiding forming a continuous stripe which results in electrical isolation between the electrodes 20 and 22. For example, the depletion regions 80A are arranged as an array with one column and M rows, in which M is a positive integer. In the exemplary illustration of FIG. 1, M is eight, but the disclosure is not limited thereto.

The nitride-based semiconductor layers 16 has portions 162 between a pair of the adjacent depletion regions 80A, which are devoid of the negatively-charged ion 82. Where the depletion region 80A are located can be referred to as a high resistance portion. Zones of the 2DEG region 142 directly beneath the portions 162 which are present between the pair of the adjacent depletion regions 80A can be referred to as a low resistance portion (or channel portion).

Figure 1C:
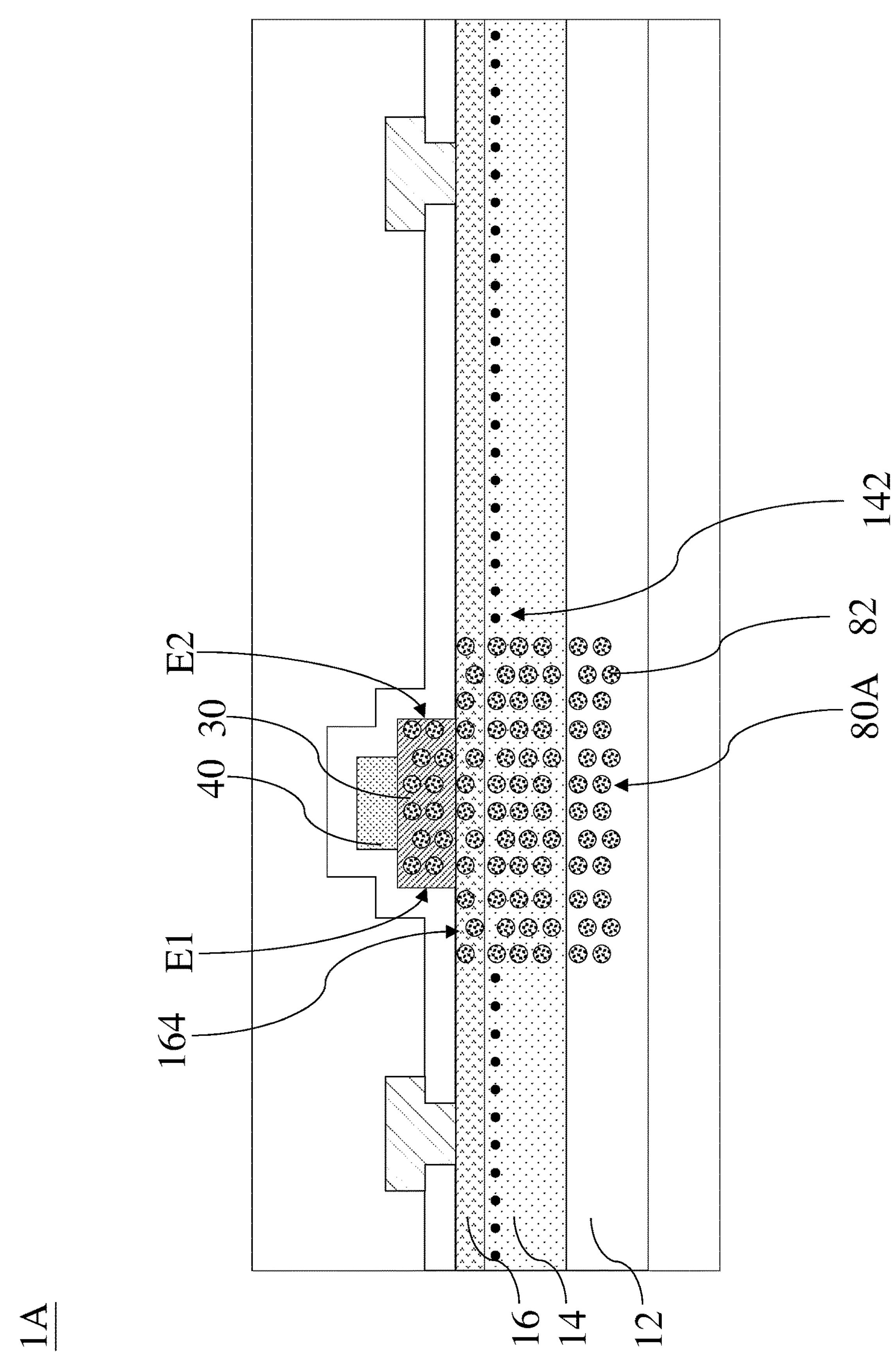
FIG. 1C is a vertical cross-sectional view across a line 1C-1C' of the semiconductor device in FIG. 1A.

To further illustrate the distributed range of the negatively-charged ion 82, FIG. 1C is a vertical cross-sectional view across a line 1C-1C' of the semiconductor device 1A in FIG. 1A. The depletion region 80A is located beneath the gate electrode 40 and the doped nitride-based semiconductor layer 30. The 2DEG region 142 has the depleted/blocked zone overlapping with the depletion region 80A.

The depletion region 80A can extend from the doped nitride-based semiconductor layer 30 downward to the nitride-based semiconductor layers 14 and 16. The depletion region 80A can extend from a top surface of the doped nitride-based semiconductor layer 30 downward to the buffer layer 12. In the exemplary illustration of FIG. 1C, the depletion region 80A extend to a top portion of the buffer layer 12 and out of a bottom portion of the buffer layer 12. In other embodiments, the depletion region 80A extend to the bottom portion of the buffer layer 12.

The width of the depletion region 80A is greater than the gate electrode 40. For example, the doped nitride-based semiconductor layer 30 has a pair of opposite edges E1 and E2 out of the gate electrode 40, and the negatively-charged ions 82 are distributed in the doped nitride-based semiconductor layer 30 and along the edges E1 and E2 of the doped nitride-based semiconductor layer 30.

Furthermore, the nitride-based semiconductor layer 16 has a portion 164 free from coverage by the doped nitride-based semiconductor layer 30 and overlaps with the depletion regions 80A. The depletion region can be wider than the doped nitride-based semiconductor layer 30. The depletion region 80A has a top area within the doped nitride-based semiconductor layer 30 and a bottom area at least within the nitride-based semiconductor layers 14 and 16. The bottom area of the depletion region can be wider than the top area of the depletion region 80A. The passages related to FIG. 1C is made for clearly defining the distributed range of the doping negatively-charged ions 82.

Figure 1D:
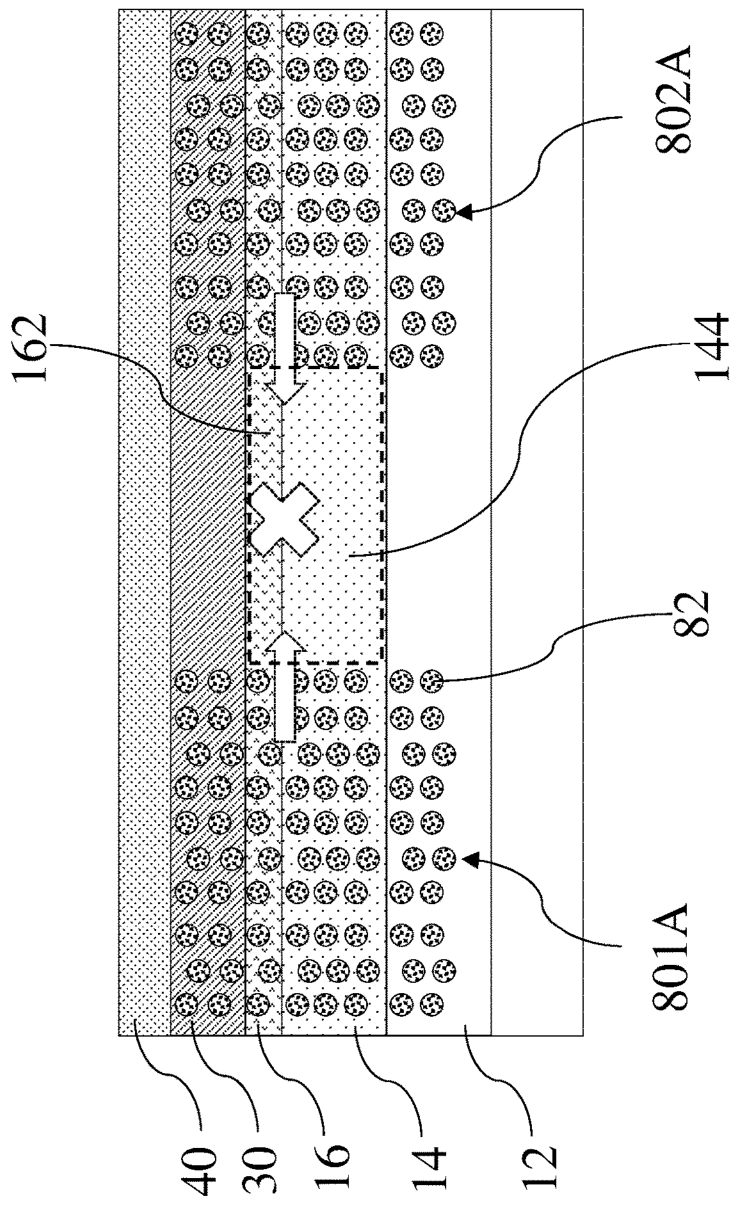
FIG. 1D is a vertical cross-sectional view across a line 1D-1D' of the semiconductor device in FIG. 1A.

To illustrate how the normally-off mode achieves, FIG. 1D is a vertical cross-sectional view across a line 1D-1D' of the semiconductor device 1A in FIG. 1A. Referring to FIG. 1D, by doping the negatively-charged ions 82 to formed separated depletion regions 801A and 802A, the portion 162 of the nitride-based semiconductor layer 16 is sandwiched by the depletion regions 801A and 802A. The nitride-based semiconductor layer 14 includes a portion 144 sandwiched by the depletion regions 801A and 802A as well. The combination of the portions 144 and 162 is surrounded by the doped nitride-based semiconductor layer 30 and the pair depletion regions 801A and 802A.

The negatively-charged ions 82 can deplete the zone of the 2DEG region in the combination of the portions 144 and 162 from its side direction. Specifically, the zone of the 2DEG region in the combination of the portions 144 and 162, which is at a position under the gate electrode 40, can be laterally depleted by the immobile negatively-charged ions 82 in the pair of the adjacent depletion regions 801A and 802A. Moreover, the doped nitride-based semiconductor layer 30 can deplete the zone of the 2DEG region in the combination of the portions 144 and 162.

Accordingly, even if the 2DEG region has a high concentration for the purpose of satisfying the high current demand, the doped nitride-based semiconductor layer 30 in conjunction with the negatively-charged ions 82 in the depletion regions 801A and 802A can deplete the zone of the 2DEG region in the portions 144 and 162. As such, the semiconductor device 1A can have extremely low off-state current.

Furthermore, since the depletion regions 801A and 802A extend from the doped nitride-based semiconductor layer 30 downward to the nitride-based semiconductor layers 14 and 16, and to the buffer layer 12, the laterally depletion of the depletion regions 801A and 802A is enhanced. In some embodiments, as the enhancement of the laterally depletion is sufficient to achieve the normally-off mode in the high current devices, the reason for that the depletion regions 801A and 802A remains out of the bottom portion of the buffer layer 12 is to avoid resistivity rising in the 2DEG region.

As afore described, with respect to the high current products, only a doped nitride-based semiconductor layer may not be sufficient to achieve a normally-off mode, so the present disclosure is to provide a solution for achieve a normally-off mode. Moreover, the depletion regions 80A are arranged as an array to keep the low resistance portion in the 2DEG region, which is advantageous to the operation when the device is switched on. On the contrary, once depletion regions formed by negatively-charged ions are arranged as being entirely beneath a gate electrode, on-resistance (Ron) will be greatly raised.

Referring back to FIG. 1B. The passivation layer 50 can be disposed on/over/above the nitride-based semiconductor layer 16. The passivation layer 50 covers the doped nitride-based semiconductor layer 30 and the gate electrode 40, so as to form a protruding portion. The passivation layer 50 has a plurality of contact holes CH. Each of the electrodes 20 and 22 extend through the contact hole CH, so as to make a contact with the nitride-based semiconductor layer 16. The material of the passivation layer 50 can include, for example but are not limited to, dielectric materials. For example, the passivation layer 50 can include $SiN_x$, $SiO_x$, SiON, SiC, SiBN, SiCBN, oxides, nitrides, plasma enhanced oxide (PEOX), or combinations thereof.

The passivation layer 60 covers the electrodes 20 and 22, the passivation layer 50, and the gate electrode 40. In some embodiments, the passivation layer 60 can serve as a planarization layer which has a level top surface to support other layers/elements. In some embodiments, the passivation layer 60 can be formed as a thicker layer, and a planarization process, such as chemical mechanical polish (CMP) process, is performed on the passivation layer 60 to remove the excess portions, thereby forming a level top surface. The material of the passivation layer 60 can include, for example but are not limited to, dielectric materials. For example, the passivation layer 60 can include $SiN_x$, $SiO_x$, SiON, SiC, SiBN, SiCBN, oxides, nitrides, plasma enhanced oxide (PEOX), or combinations thereof.

Different stages of a method for manufacturing the semiconductor device 1A are shown in FIG. 2A, FIG. 2B, FIG. 2C, FIG. 2D, FIG. 2E, FIG. 2F and FIG. 2G, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
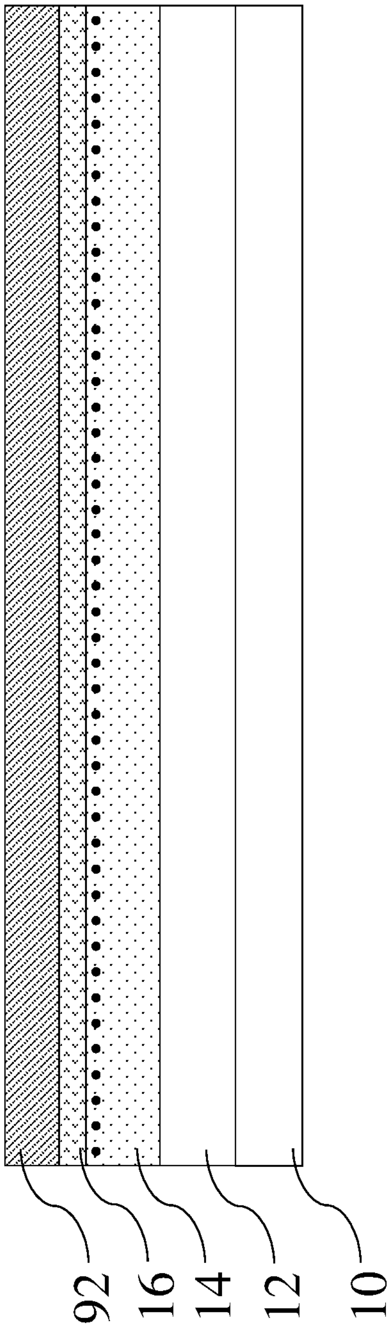
FIG. 2A, FIG. 2B, FIG. 2C, FIG. 2D, FIG. 2E, FIG. 2F, and FIG. 2G show different stages of a method for manufacturing a nitride-based semiconductor device according to some embodiments of the present disclosure.

Referring to FIG. 2A, a buffer layer 12 can be formed on/over/above a substrate 10 by using deposition techniques. A nitride-based semiconductor layer 14 can be formed on/over/above the buffer layer 12 by using deposition techniques. A nitride-based semiconductor layer 16 can be formed on/over/above the nitride-based semiconductor layer 14 by using deposition technique, so that a heterojunction is formed therebetween. A blanket doped nitride-based semiconductor layer 92 can be formed on/over/above the nitride-based semiconductor layer 16.

Figure 2B:
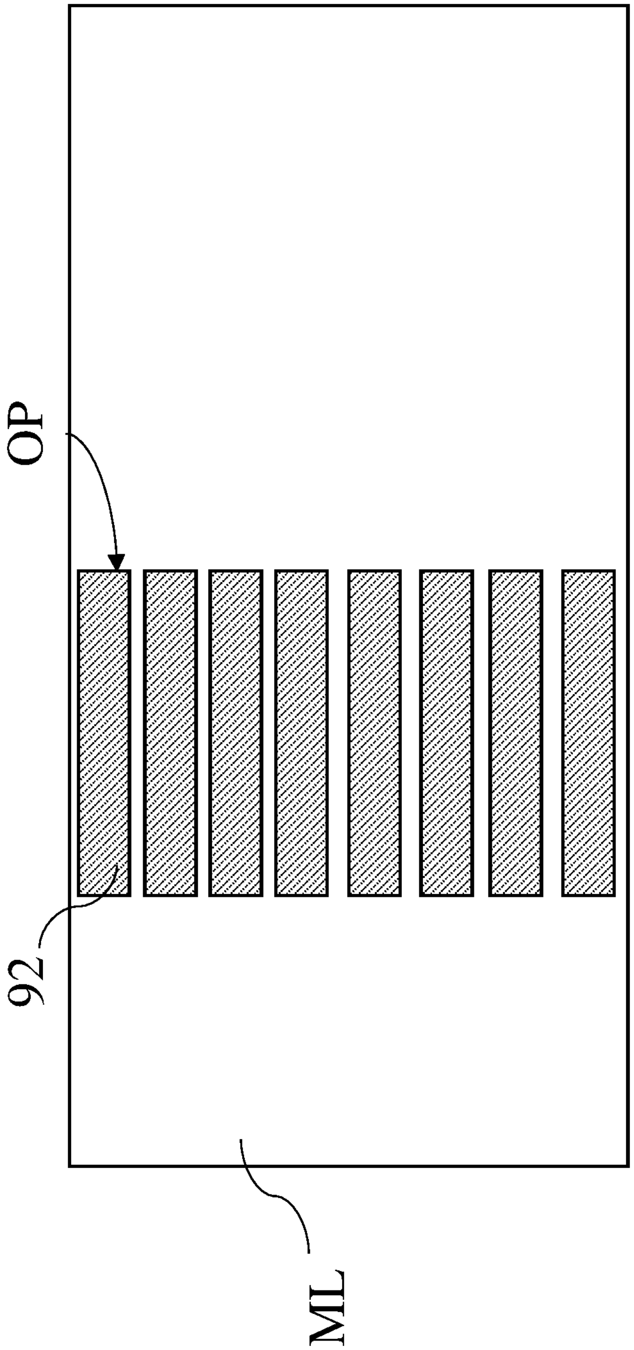

Referring to FIG. 2B, a mask layer ML with openings OP is formed on/over/above the blanket doped nitride-based semiconductor layer 92 to expose portions of the blanket doped nitride-based semiconductor layer 92.

Figure 2C:
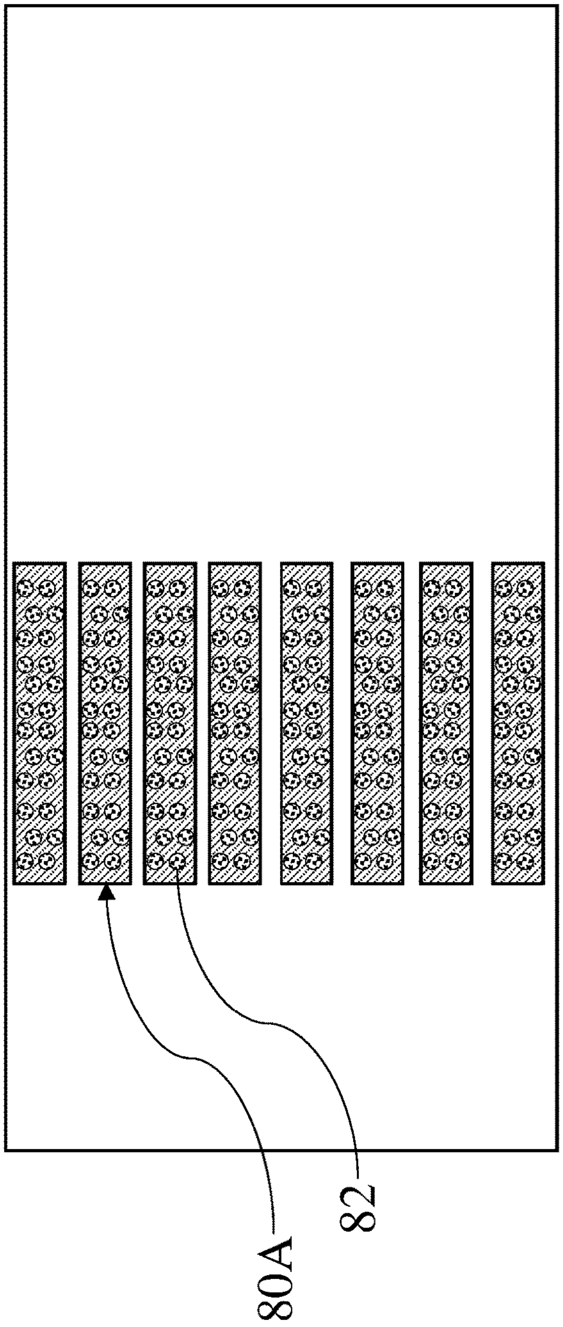

Referring to FIG. 2C, an ion implantation process is performed on the exposed portions of the blanket doped nitride-based semiconductor layer 92 using negatively-charged ions 82 selected from highly electronegative group, so as to form a plurality of depletion regions 80A separated from each other. The negatively-charged ions 82 can include fluorine or chlorine.

Figure 2D:
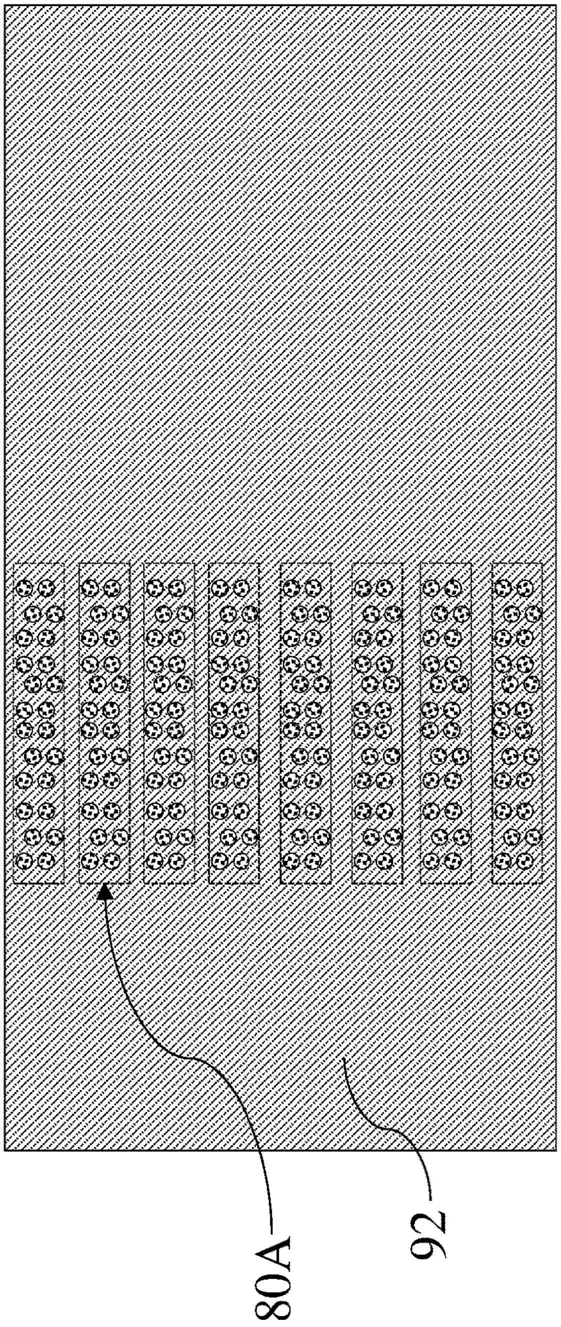

Referring to FIG. 2D, the mask layer ML is removed, so as to expose the blanket doped nitride-based semiconductor layer 92. The depletion regions 80A are arranged in the blanket doped nitride-based semiconductor layer 92 as an array.

Figure 2E:
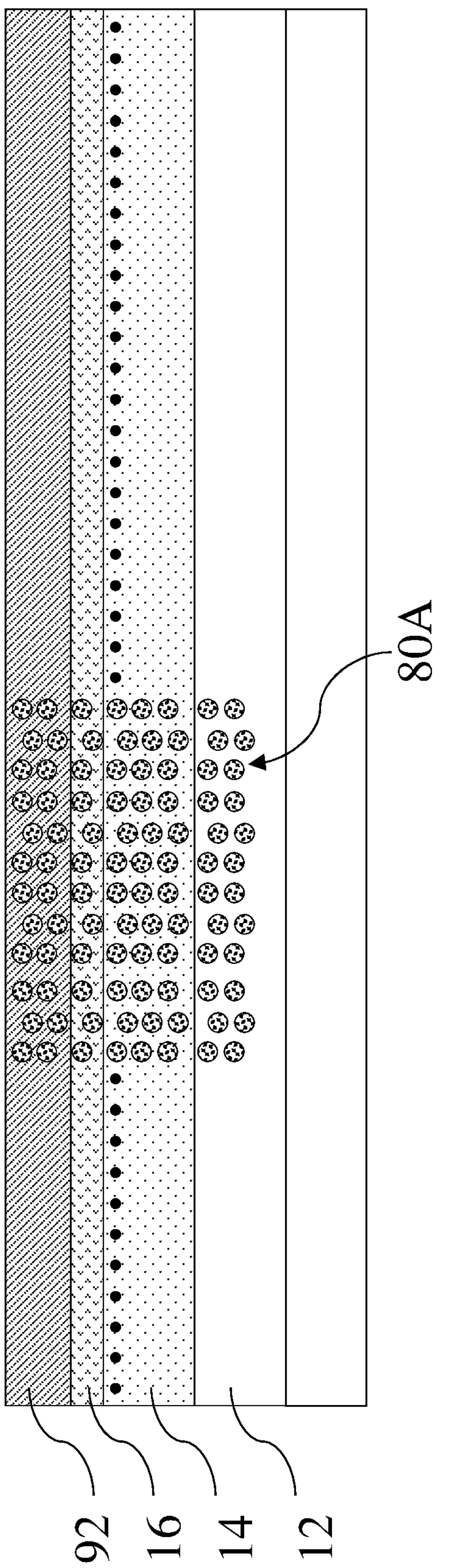

The FIG. 2E is a vertical cross-sectional view across the FIG. 2D. Referring to FIG. 2E, the ion implantation process is performed such that the depletion regions 80A extend downward to the buffer layer 12 through the nitride-based semiconductor layers 14 and 16. The depth of the depletion region 80A can be controlled by adjusting the implantation energy. That is, the negatively-charged ions 82 are implanted into the buffer layer 12 and the nitride-based semiconductor layers 14 and 16. The implanted depth of the negatively-charged ions 82 can be controlled by adjusting the implantation energy.

Figure 2F:
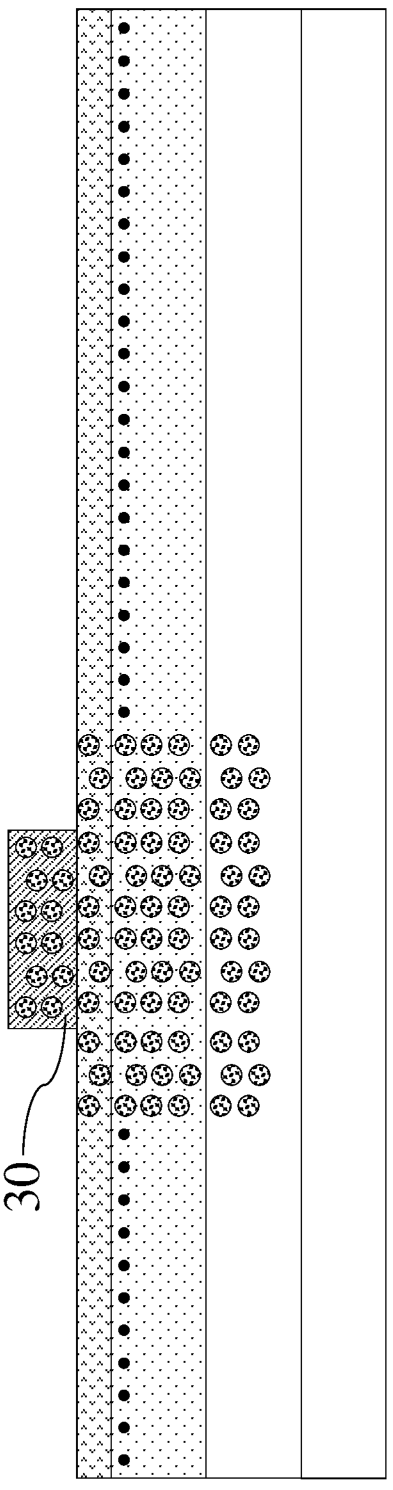

Referring to FIG. 2F, a patterning process is performed on the blanket doped nitride-based semiconductor layer 92 for removing excess portions thereof, so as to form the doped nitride-based semiconductor layer 30. The blanket doped nitride-based semiconductor layer 92 is patterned, such that each of the depletion regions 80A is wider than the doped nitride-based semiconductor layer 30.

Figure 2G:
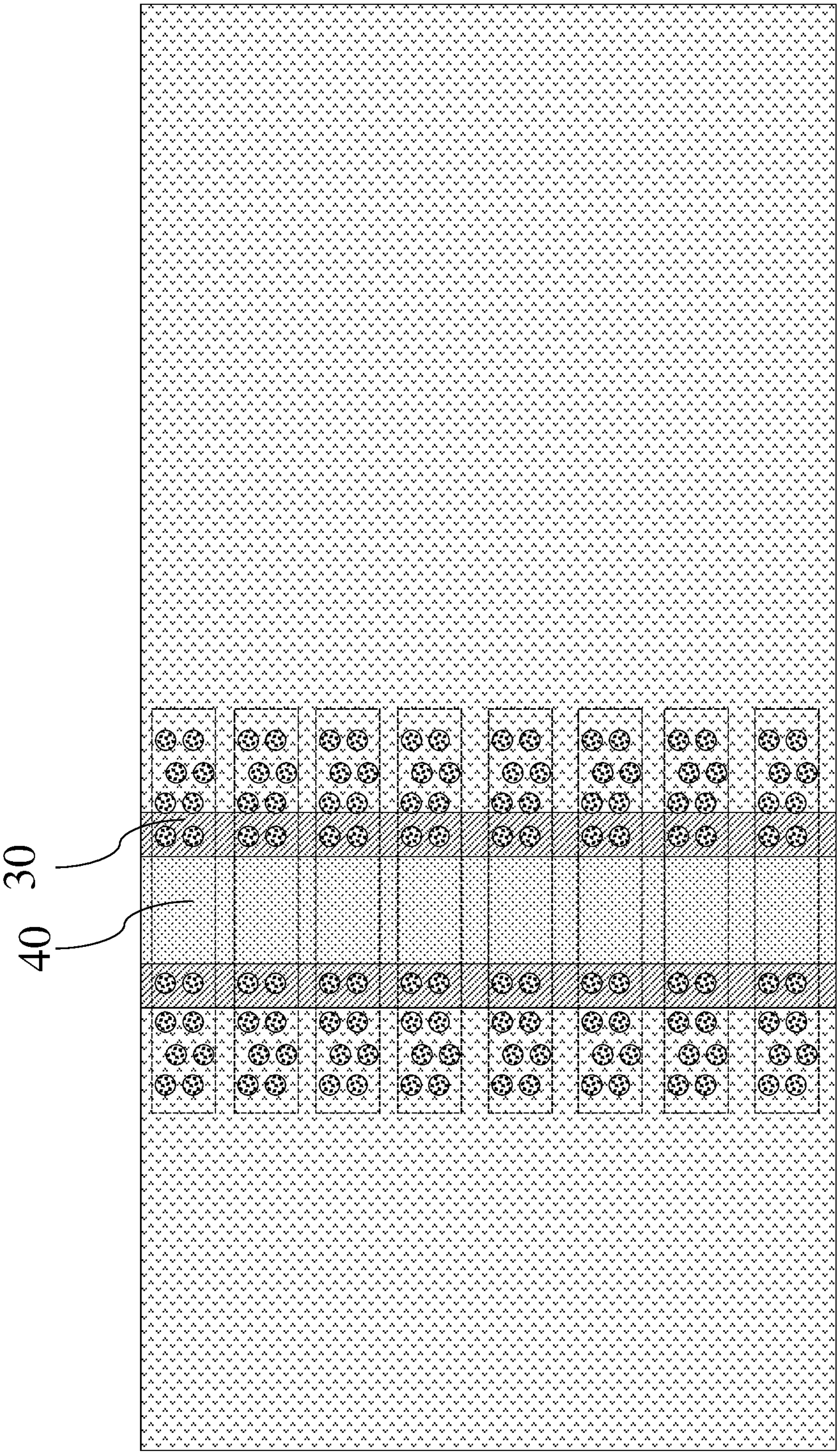

Referring to FIG. 2G, a gate electrode 40 can be formed on/over/above the doped nitride-based semiconductor layer 30. The formation of the gate electrode 40 includes deposition techniques and a patterning process. In some embodiments, the deposition techniques can be performed for forming a blanket layer, and the patterning process can be performed for removing excess portions thereof. In some embodiments, the patterning process can include photolithography, exposure and development, etching, other suitable processes, or combinations thereof. Thereafter, the passivation layers 50 and 60 can be formed, obtaining the configuration of the semiconductor device 1A as shown in FIG. 1B.

Figure 3:
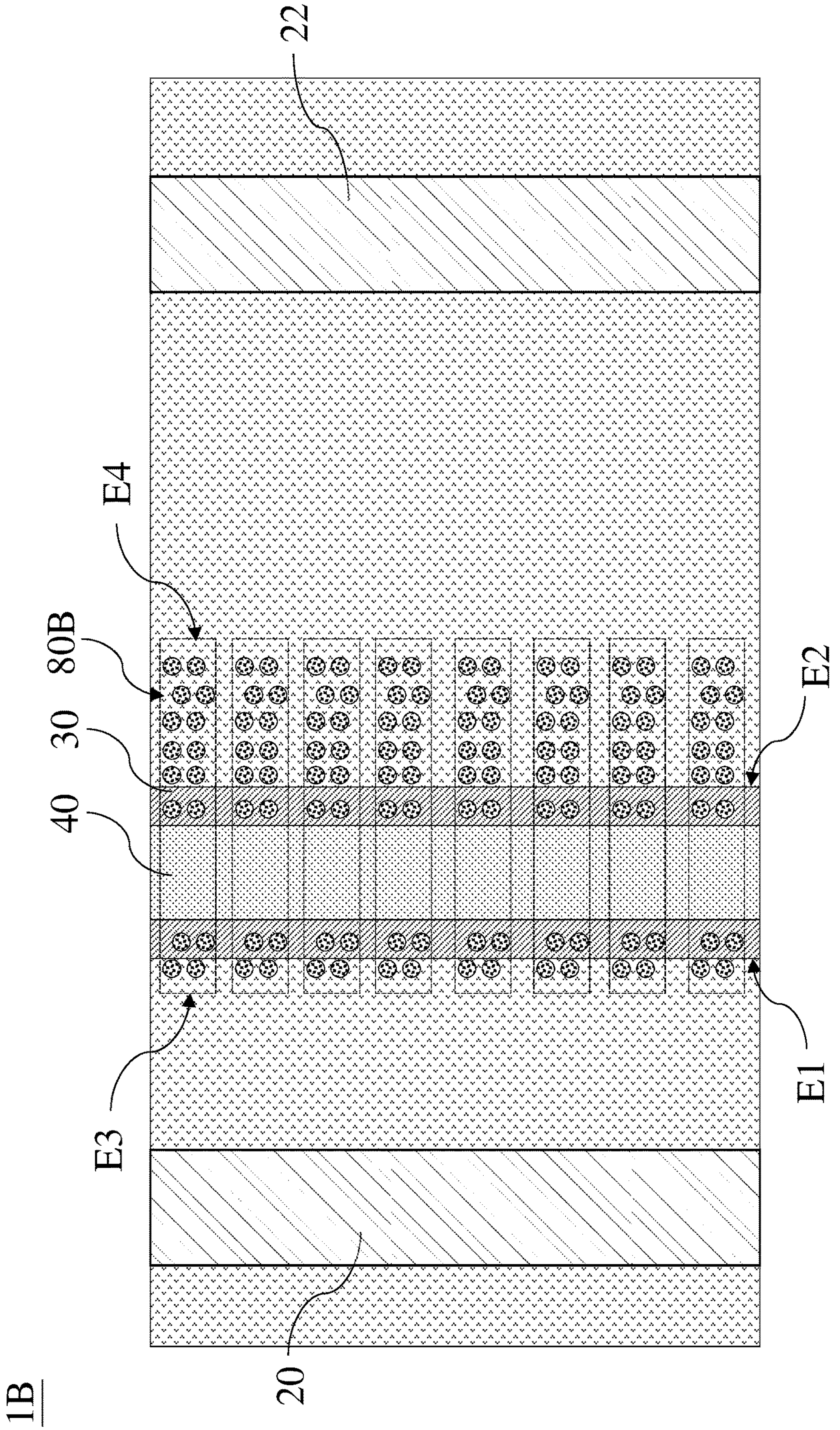
FIG. 3 is a top view of a semiconductor device according to some embodiments of the present disclosure.

FIG. 3 is a top view of a semiconductor device 1B according to some embodiments of the present disclosure. The semiconductor device 1B is similar to the semiconductor device 1A as described and illustrated with reference to FIG. 1A, except that the depletion regions 80A in FIG. 1A are replaced by depletion regions 80B. Each of the depletion regions 80B is asymmetric about the doped nitride-based semiconductor layer 30 and the gate electrode 40.

Specifically, the doped nitride-based semiconductor layer 30 has two opposite edges Eland E2; and the depletion region 80B has two opposite edges E3 and E4. The edges E1 and E3 face the electrode 20 and the edges E2 and E4 face the electrode 22. A distance between the edge E2 to the edge E4 is greater than a distance between the edge E1 to the edge E3, so as to match the distance relationship among the electrodes 20 and 22 and the depletion regions 80B. As such, high resistance portions defined by the depletion region 80B can be formed closer to the electrode 22, thereby further complying with the high voltage device requirements. For example, such the configuration can further improve the current density in a region between the gate electrode 40 and the electrode 22, especially near the gate electrode 40.

Figure 4:
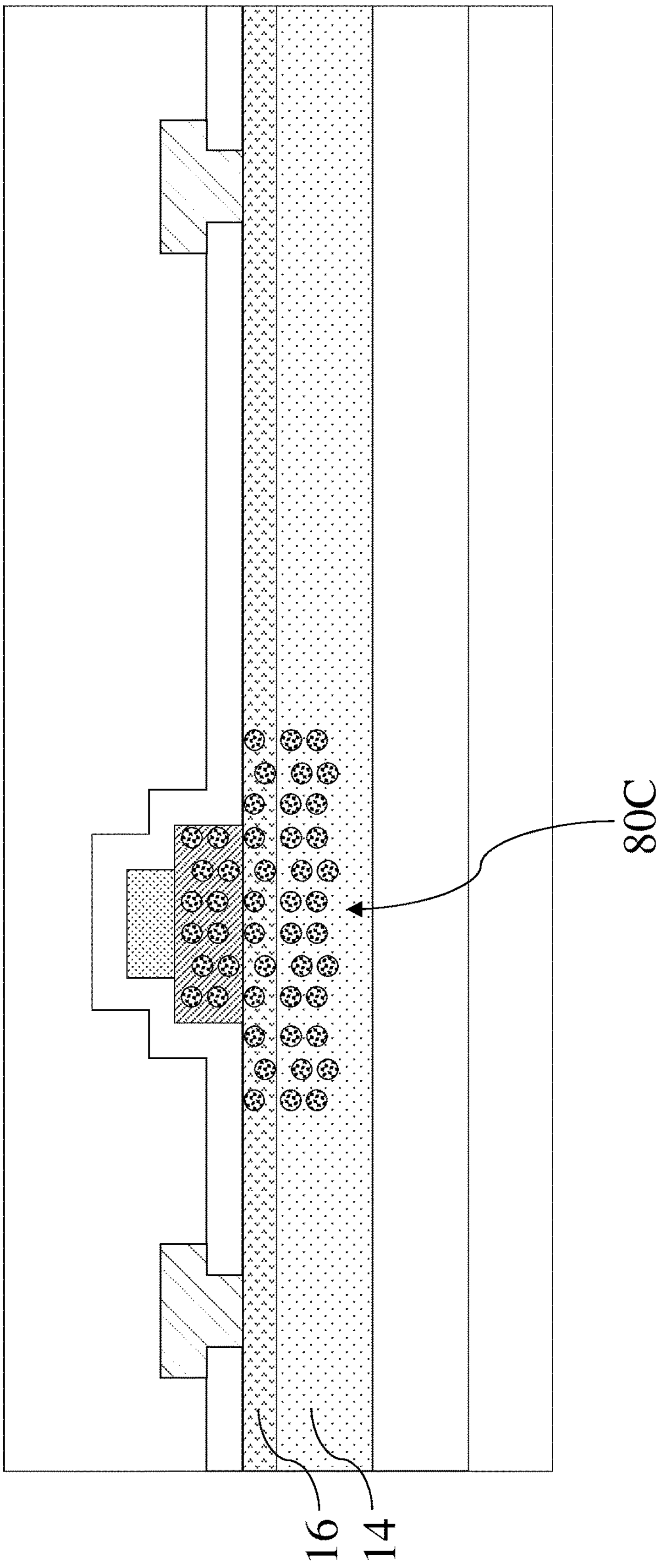
FIG. 4 is a vertical cross-sectional view of a semiconductor device according to some embodiments of the present disclosure.

FIG. 4 is a vertical cross-sectional view of a semiconductor device 1C according to some embodiments of the present disclosure. The semiconductor device 1C is similar to the semiconductor device 1A as described and illustrated with reference to FIG. 1B, except that the depletion region 80A in FIG. 1A are replaced by depletion region 80C. The depletion region 80C extends downward from a top surface of the doped nitride-based semiconductor layer 30 to the nitride-based semiconductor layer 14 through the nitride-based semiconductor layer 16. The bottom boundary of the depletion region 80C is present within the thickness of the nitride-based semiconductor layer 14. As such, the laterally depletion caused by the depletion region 80C is weaker than the depletion region 80A in FIG. 1A so the semiconductor device can be optionally applied to the desired requirement. The exemplary structure in FIG. 4 can be achieve by lowering the implantation energy of negatively-charged ions.

Based on the above description, in the embodiments of the present disclosure, the doped nitride-based semiconductor layer and the negatively-charged ions in the depletion regions can collaboratively deplete at least one zone of the 2DEG region directly under the gate electrode. The depletion regions can be formed as an array. Portion of the 2DEG region vertically overlapping with the depletion regions are depleted. The depletion regions can further laterally deplete the rest of the 2DEG region. Accordingly, the off-state of the semiconductor device is achieved. Moreover, the semiconductor device is easy to be fabricated, so the semiconductor device can have high yield rate and low manufacturing cost. The process for manufacturing the semiconductor device is flexible and the strength of the laterally depletion can be optionally adjusted.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 11 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:

a first nitride-based semiconductor layer;

a second nitride-based semiconductor layer disposed on the first nitride-based semiconductor layer and having a bandgap greater than a bandgap of the first nitride-based semiconductor layer;

a gate electrode disposed above the second nitride-based semiconductor layer;

a doped nitride-based semiconductor layer disposed between the second nitride-based semiconductor layer and the gate electrode;

a plurality of negatively-charged ions selected from a highly electronegative group and distributed within a plurality of depletion regions which extend downward from the doped nitride-based semiconductor layer and are located beneath the gate electrode, wherein any pair of the adjacent depletion regions are separated from each other, wherein each of the depletion regions has a width greater than the gate electrode, and the first and second nitride-based semiconductor layers have portions between a pair of the adjacent depletion regions which are devoid of the negatively-charged ion selected from highly electronegative group;

a source electrode disposed above the second nitride-based semiconductor layer and spaced apart from the depletion regions; and a drain electrode disposed above the second nitride-based semiconductor layer and spaced apart from the depletion regions.

2. The semiconductor device of claim 1, wherein the gate electrode extends along an extending direction, and the depletion regions are arranged along the extending direction.

3. The semiconductor device of claim 2, wherein the depletion regions are arranged as an array with one column and M rows, where M is a positive integer.

4. The semiconductor device of claim 1, wherein the depletion regions further extend downward to the first and second nitride-based semiconductor layers.

5. The semiconductor device of claim 1, wherein each of the depletion regions has a top area within the doped nitride-based semiconductor layer and a bottom area within the first and second nitride-based semiconductor layers and wider than the top area.

6. The semiconductor device of claim 1, wherein the second nitride-based semiconductor layer has a portion free from coverage by the doped nitride-based semiconductor layer and overlapping with the depletion regions.

7. The semiconductor device of claim 1, further comprising:

a buffer layer disposed beneath the first nitride-based semiconductor layer, wherein the depletion regions further extend downward to the buffer layer.

8. The semiconductor device of claim 7, wherein the depletion regions extend to a top portion of the buffer layer and out of a bottom portion of the buffer layer.

9. The semiconductor device of claim 1, wherein the doped nitride-based semiconductor layer has a pair of opposite edges out of the gate electrode, and the negatively-charged ions are distributed along the edges.

10. The semiconductor device of claim 1, wherein the source electrode is closer to the depletion regions than the drain electrode.

11. The semiconductor device of claim 1, wherein the negatively-charged ions include fluorine or chlorine.

12. The semiconductor device of claim 1, wherein the first and second nitride-based semiconductor layers form a heterojunction therebetween with a two-dimensional electron gas (2DEG) region, which is depleted at a position under the gate electrode by the depletion regions.

13. The semiconductor device of claim 1, wherein at least one pair of the adjacent depletion regions laterally deplete a zone of the 2DEG region therebetween.

14. A method for manufacturing a semiconductor device, comprising:

forming a first nitride-based semiconductor layer;

forming a second nitride-based semiconductor layer on the first nitride-based semiconductor layer;

forming a blanket doped nitride-based semiconductor layer on the second nitride-based semiconductor layer;

forming a mask layer with openings over the blanket doped nitride-based semiconductor layer to expose portions of the blanket doped nitride-based semiconductor layer;

performing an ion implantation process on the exposed portions of the blanket doped nitride-based semiconductor layer using negatively-charged ions selected from highly electronegative group, so as to form a plurality of depletion regions separated from each other, wherein the first and second nitride-based semiconductor layers have portions between a pair of the adjacent depletion regions which are devoid of the negatively-charged ion selected from highly electronegative group; and forming a gate electrode over the blanket doped nitride-based semiconductor layer, wherein each of the depletion regions has a width greater than the gate electrode;

patterning the blanket doped nitride-based semiconductor layer to form a doped nitride-based semiconductor layer and to expose the second nitride-based semiconductor layer, wherein the depletion regions extend downward from the doped nitride-based semiconductor layer.

15. The method of claim 14, wherein patterning the blanket doped nitride-based semiconductor layer is performed such that each of the depletion regions is wider than the doped nitride-based semiconductor layer.

16. The method of claim 14, wherein the ion implantation process is performed such that the depletion regions extend downward to the first nitride-based semiconductor layer.

17. The method of claim 16, wherein the first nitride-based semiconductor layer is formed on a buffer layer, and the depletion regions extend downward to the buffer layer.

18. The method of claim 14, wherein the negatively-charged ions include fluorine or chlorine.

* * * * *